(12) United States Patent
Whitted

(10) Patent No.: US 8,011,742 B1
(45) Date of Patent: Sep. 6, 2011

(54) TILT-OUT SHELF GUIDE MECHANISM SUITABLE FOR RACK MOUNT COMPUTING SYSTEMS

(75) Inventor: William H. Whitted, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 1192 days.

(21) Appl. No.: 10/675,233

(22) Filed: Sep. 29, 2003

(51) Int. Cl.
*A47B 88/00* (2006.01)

(52) U.S. Cl. .................................. 312/322; 108/143

(58) Field of Classification Search .................. 108/143, 108/137, 5, 8; 312/322, 323, 313
See application file for complete search history.

(56) References Cited

U.S. PATENT DOCUMENTS

| 4,441,771 A | * | 4/1984 | Roesler | 312/322 |
| 4,600,255 A | * | 7/1986 | Dubarko | 108/143 |
| 4,931,978 A | * | 6/1990 | Drake et al. | 108/143 |
| 5,037,163 A | * | 8/1991 | Hatcher | 312/323 |
| 5,201,575 A | * | 4/1993 | Stolzel | 312/323 |
| 5,385,399 A | * | 1/1995 | Weidner | 312/323 |
| 5,957,558 A | * | 9/1999 | Quade | 312/323 |
| 6,637,841 B1 | * | 10/2003 | Dumornay | 312/9.48 |
| 6,702,410 B2 | * | 3/2004 | Kusztal et al. | 312/322 |

FOREIGN PATENT DOCUMENTS

JP   52053700 A   *   4/1977

* cited by examiner

*Primary Examiner* — Jose V Chen
(74) *Attorney, Agent, or Firm* — Fish & Richardson P.C.

(57) ABSTRACT

Tilt out shelf guide mechanism suitable for rack mount computing systems are disclosed. The mechanism generally includes a slidable shelf and two opposing shelf tracks configured to support and guide the shelf. The slidable shelf incorporates a storage or component mounting region and a rear catch mechanism at the rear end of the shelf. The rear catch mechanism has a shelf-mounted pivot. The two opposing shelf tracks incorporate a pivot support at the front end of the tracks configured to engage the pivot of the shelf when the rear end of the shelf is approximately adjacent to the front end of the tracks, whereupon the pivot of the shelf is supported by the rear catch mechanism of the guides and the shelf is pivotable about the pivot.

25 Claims, 3 Drawing Sheets

TILT-OUT SHELF GUIDE MECHANISM SUITABLE FOR RACK MOUNT COMPUTING SYSTEMS

BACKGROUND OF THE INVENTION

1. Field of the Invention

The present invention relates generally to rack mount computer systems. More specifically, tilt out shelf guide mechanism suitable for rack mount computing systems are disclosed.

2. Description of Related Art

Many of today's more complex computing systems such as computer server systems are often rack-mounted systems in which a number of removable electronics modules, such as electronics trays, are positioned and stacked relative to each other in a shelf-like manner within a frame or rack. Rack-mounted systems allow the arrangement of several of the electronics modules in a vertical orientation for efficient use of space. Each electronics module can be slid into and out of the rack-mounting system. Typically, the electronics modules are inserted from the front of the rack and various cables such as data cables, power cables, etc., are connected to the electronics modules at the front and/or rear of the rack.

Each electronics module may correspond to a different server or each electronics module may hold one or more components of a server. Examples of electronics modules include modules for processing, storage such as random access memory (RAM), network interfaces and controllers, disk drives such as floppy disk drives, hard drives, compact disk (CD) drives, and digital video disk (DVD) drives, parallel and serial ports, small computer systems interface (SCSI) bus controllers, video controllers, power supplies, and so forth. A server farm in today's computing environment may include numerous racks that hold various types of computer-related modules.

For maintenance and other purposes, it is often desired to remove an entire electronics module from the rack for servicing and then return the module to the rack. Oftentimes, the remainder of the server system is still in operation while maintenance is performed on a particular module or a particular component within the module. For example, when a component on a particular electronics module is to be serviced or replaced, a service technician would need to remove the particular electronics module from the server rack and then remove the server component from the electronics module. In order to minimize system downtime and to reduce the effect of maintenance on the system's overall operation, the rack should provide fast and convenient access to the electronics module.

A typical rack includes four support columns forming the four corners of the rack. Racks typically have casters mounted so as to provide mobility as racks sometimes need to be moved, whether during installation, reconfiguration, testing, or for regular servicing. The rack is typically open on the front and back sides in order to provide the service technician with fast and convenient visual and physical access to the electronics modules contained in the rack. Pairs of opposing shelf supports or slide assemblies are attached to the columns to support the stack of electronics modules. To gain full access to a given electronics module, the service technician slides the electronics module forward away from the stack of remaining electronics modules in the rack.

SUMMARY OF THE INVENTION

Tilt out shelf guide mechanism suitable for rack mount computing systems are disclosed. It should be appreciated that the present invention can be implemented in numerous ways, including as a process, an apparatus, a system, a device, or a method. Several inventive embodiments of the present invention are described below. The tilt out shelf guide mechanism allows an electronics module shelf to be conveniently and easily fully slid out of the rack and either removed or tilted down to be serviced. The tilt out shelf guide mechanism is simple, inexpensive and easily incorporated into the rack mount computing system.

According to one embodiment, the mechanism generally includes a slidable shelf and two opposing shelf tracks configured to support and guide the shelf. The slidable shelf incorporates a storage or component mounting region and a rear catch mechanism at the rear end of the shelf. The rear catch mechanism has a shelf-mounted pivot. The two opposing shelf tracks incorporate a pivot support at the front end of the tracks configured to engage the pivot of the shelf when the rear end of the shelf is approximately adjacent to the front end of the tracks, whereupon the pivot of the shelf is supported by the rear catch mechanism of the guides and the shelf is pivotable about the pivot.

According to another embodiment, a system for providing access to components of a rack mount computing system generally includes a slidable electronics module shelf including an electronics components region and a rear catch mechanism at the rear end of the shelf and a pair of opposing electronics module guides to support and guide the shelf relative thereto. The rear catch mechanism may include at least one pivot. Each guide may include a track to support and guide the shelf thereon. The guides may further include a pivot support disposed at the front end of the guide and configured to engage the pivot of the shelf, whereupon the shelf is pivotable about the pivot and the pivot is supported by the pivot support of the guides. The shelf may be pivotable about the pivot such that the front end of the shelf tilts down to below the rear end of the shelf whereupon the shelf is substantially supported by the pivot support.

The pivot support may include adjoining front and a bottom guide walls. The front wall may engage the pivot to stop the shelf from sliding past the front wall away from the front end of the guide. Another pivot support may be provided at the rear end of the guide. The pivot of the shelf may be disposed below the electronics components region and/or may be coupled to the electronics components region via a connector. The shelf may also include a front stop at the front end of the shelf configured to engage the pivot support of the guides to stop the shelf from sliding past the pivot support toward the rear end of the guide.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements.

DESCRIPTION OF SPECIFIC EMBODIMENTS

Tilt out shelf guide mechanism suitable for rack mount computing systems are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Figure 1:
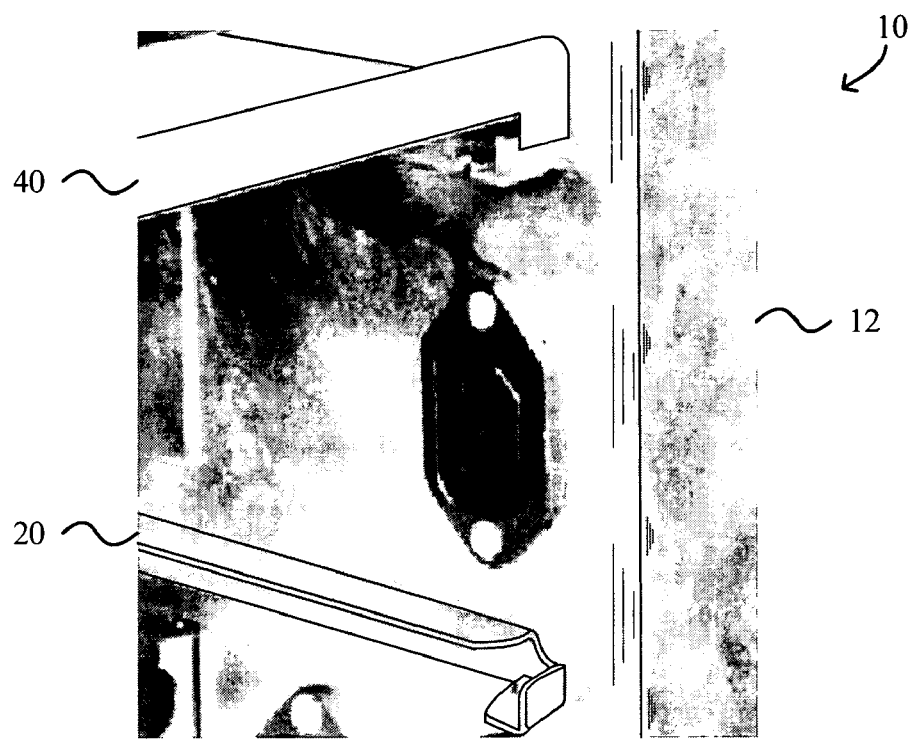
FIG. 1 is a partial front perspective view of an illustrative rack mount computing system showing two electronics module guides, one shown supporting a slidable electronics module shelf.
Figure 2:
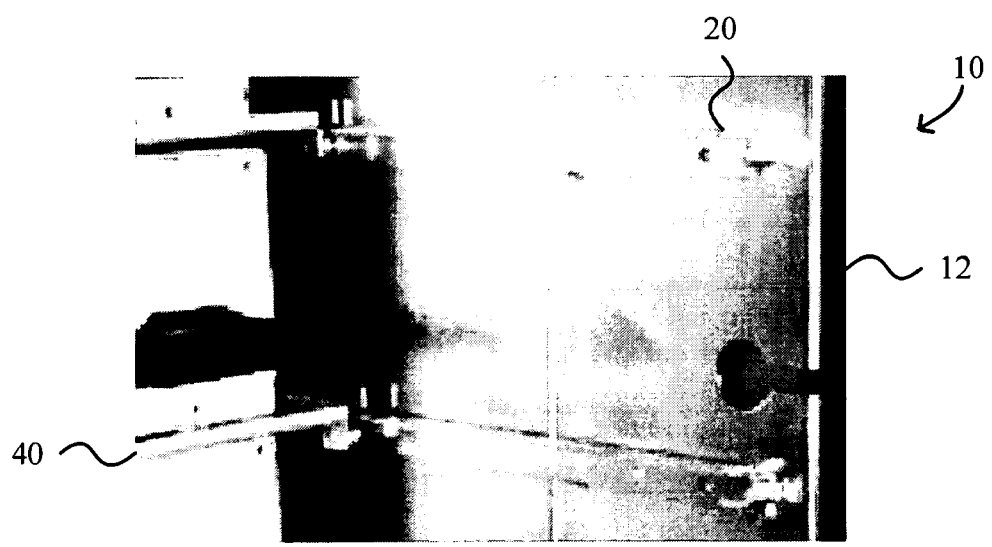
FIG. 2 is a partial rear perspective view of the rack mount computing system illustrating the rear of the slidable electronics module shelves supported on the electronics module guides.

FIG. 1 is a partial front perspective view of an illustrative rack mount computing system 10 showing two electronics module guides 20, one shown supporting a slidable electronics module or electronics module shelf 40. FIG. 2 is a partial rear perspective view of the rack mount computing system 10 illustrating the rear of the slidable electronics module shelves 40 supported on the electronics module guides 20. As shown, the rack mount computing system 10 includes a chassis or frame 12 to which the electronics module guides 20 are attached. The electronics module guides 20 may be attached to the frame 12 in any suitable manner such as screws, rivets, bolts, adhesive, welding, and so forth.

Each pair of the electronics module guides 20 supports and guides a corresponding slidable electronics module shelf 40. During normal operation of the rack mount computing system 10, each slidable electronics module shelf 40 rests upon and is supported by the corresponding electronics module guide 20. When servicing or maintenance needs to be performed on a particular electronics module shelf 40, the service technician slides the electronics module shelf 40 forward through the open front side of the frame 12 and away from the stack of remaining electronics module shelves. The service technician may then remove the electronics module shelf 40 from the frame 12 or position the electronics module shelf 40 in a service position by tilting the front end of the electronics module shelf 40 down and allowing the electronics module shelf 40 to hang from the electronics module guide 20, as will be described in more detail below.

Figure 3:
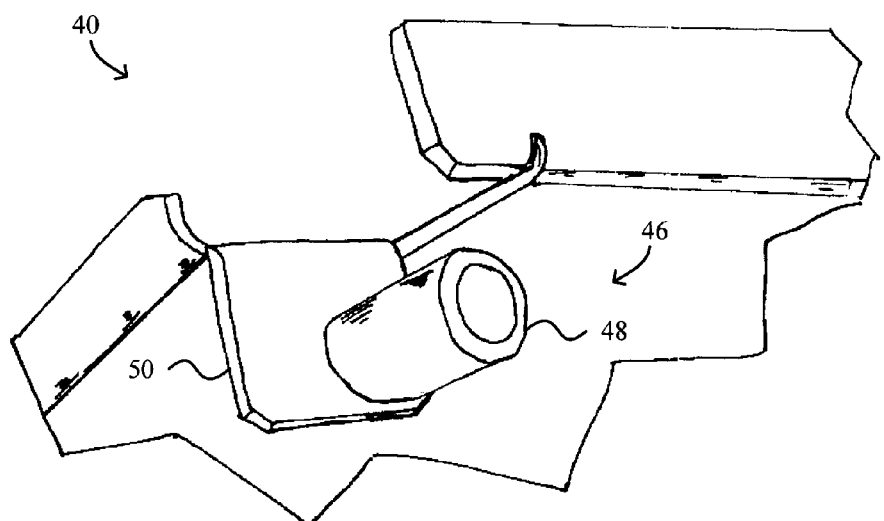
FIG. 3 is a partial perspective view of a back corner of the slidable electronics module shelf.
Figure 4:
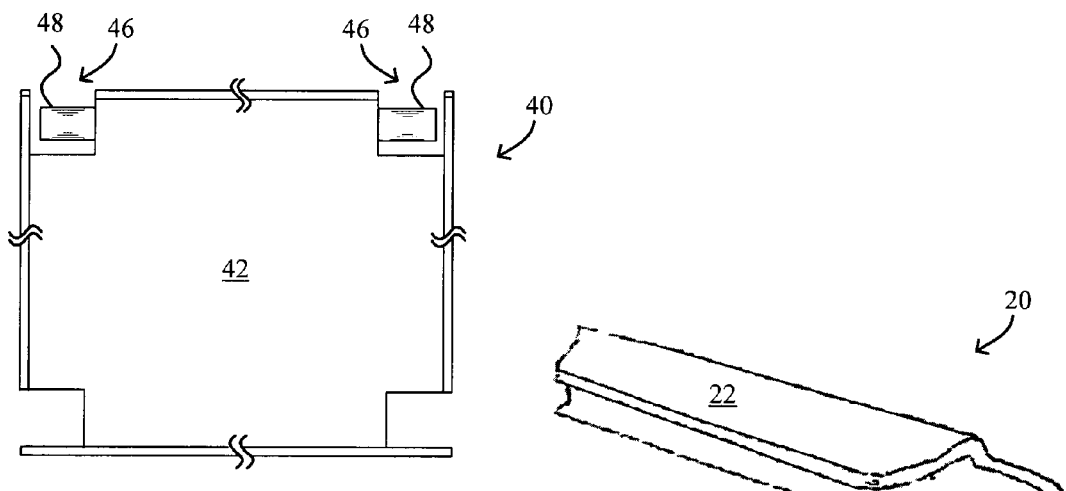
FIG. 4 is a top plan view of the slidable electronics module shelf.
Figure 5:
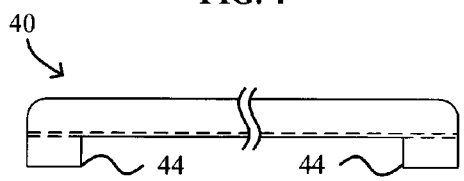
FIG. 5 is a front plan view of the slidable electronics module shelf.

The slidable electronics module shelf 40 is shown in more detail in FIG. 3-5. In particular, FIG. 3 is a partial perspective view of a back corner of the slidable electronics module shelf 40 and FIGS. 4 and 5 are a top plan view and a front plan view of the slidable electronics module shelf 40. The slidable electronics module shelf 40 may include a components region 42 on which electronics components may be mounted, front stops 44 and a rear catch mechanism 46.

The front stops 44 are disposed at the front of the slidable electronics module shelf 40, defined as the side that is accessed through the front or rear of the frame of the rack mount system. The rear of the slidable electronics module shelf 40 is defined to be the side that is the opposite the front side of the front of the shelf 40. Typically, the electronics module shelf 40 can be accessed from either the front or the rear of the rack mount system. For purposes of clarity, the description herein is in terms of the slidable electronics module shelf 40 being accessed from the front of the frame of the rack mount system.

The front stops 44 may be provided to stop the slidable electronics module shelf 40 from being slid into the frame from the front of the frame beyond a predetermined ingress point relative to the guide 20. In other words, the front stops 44 help prevent the slidable electronics module shelf 40 from being slid too far into the frame of the rack mount computing system from the front of the frame. For example, the front stops 44 may be tabs or "feet" that extend below the components region 42 and configured to engage or otherwise cooperate with the electronics module guide 20. Thus, when the slidable electronics module shelf 40 has been slid sufficiently far into the frame from the front of the frame to the predetermined ingress point relative to the guide 20, the front stops 44 catch or engage the guide 20 such that the electronics module shelf 40 cannot be slid any further into the frame of the rack mount system.

The rear catch mechanism 46 of the slidable electronics module shelf 40 is disposed at the rear of the slidable electronics module shelf 40. The rear catch mechanism 46 generally includes a catch 48 and a coupler or connector 50 on each of the left and right sides of the electronics module shelf 40. The coupler 50 couples the catch 48 to the components region 42. The catch 48 may help stop the slidable electronics module shelf 40 from being accidentally slid out of the frame through the front of the frame beyond a predetermined egress point relative to the guide 20. In other words, the catch 48 helps to prevent the slidable electronics module shelf 40 from being slid too far out of the frame of the rack mount system through the front of the frame.

One example of the rear catch mechanism 46 is shown in more detail in FIG. 3. In particular, the catch 48 may be a pin or plug that is located below the components region 42 via the connector 50. The catch 48 is shown to be cylindrical as is preferred but may have any suitable shape. The catch or pin 48 is configured to engage or otherwise cooperate with the electronics module guide 20 such that when the slidable electronics module shelf 40 has been slid sufficiently out of the frame through the front of the frame to the predetermined egress point relative to the guide 20, the pin 48 prevents the electronics module shelf 40 from being slid out any further. The pin 48 preferably also allows the electronics module shelf 40 to be pivoted, i.e., tilted down such the electronics module shelf 40 faces toward the front of the rack mount system. In this position, the electronics module shelf 40 hangs from and is substantially supported by the electronics module guide 20 via the pins 48 of the rear catch mechanism 46.

Figure 6:
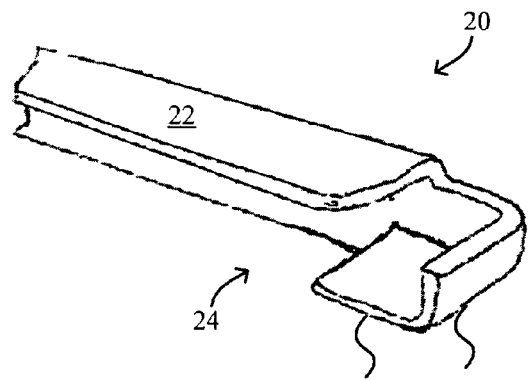
FIG. 6 is a partial perspective view of a front end of the electronics module guide.

FIG. 6 is a partial perspective view of a front end of the electronics module guide 20. A pair of opposing electronics module guides 20 is provided to support and guide each electronics module shelf 40. As shown, the electronics module guide 20 includes a track 22 on which the electronics module shelf 40 slides and on which the electronics module shelf 40 is supported. When the electronics module shelf 40 slides over the track 22, the pin 48 of the shelf 40 is configured to slide under the track 22. The pin 48 may help to prevent the electronics module shelf 40 from prematurely tipping down due to its own weight prior to the electronics module shelf 40 being fully extended.

The electronics module guide 20 also includes a pin support and stop 24. The pin support and stop 24 may be L-shaped to include a front wall 26 and a bottom wall 28. The pin support and stop 24 is located and configured to cooperate with the front stop 44 of the electronics module shelf 40 to facilitate stopping the slidable electronics module shelf 40 from being slid into the frame from the front of the frame beyond the predetermined ingress point relative to the guide 20. In other words, the front stop 44 of the electronics module shelf 40 would engage a front side of the front wall 26 of the pin support and stop 24 so that the slidable electronics module shelf 40 is prevented from sliding further into the frame of the rack mount system beyond the predetermined ingress point relative to the guide 20.

In addition, the pin support and stop 24 is also located and configured to cooperate with the pin 48 of the electronics module shelf 40 to facilitate stopping the slidable electronics module shelf 40 from being accidentally slid out of the frame through the front of the frame beyond the predetermined egress point relative to the guide 20. In particular, the front wall 26 of pin support and stop 24 would engage the pin 48 of the electronics module shelf 40 so as to prevent the slidable electronics module shelf 40 from sliding further out of the frame of the rack mount system beyond the predetermined egress point relative to the guide 20. When the slidable electronics module shelf 40 is slid out of the frame until its catch 48 engages the front wall 26 of the pin support and stop 24, the shelf 40 is in a fully extended position. Note that the pin support and stop 24 and the catch 48 should be configured so that the coupler 50 of the pin 48 does not engage or otherwise interfere with the front and bottom walls 26, 28 of the pin support and stop 24.

The pin support and stop 24 is further located and configured to cooperate with the pin 48 of the electronics module shelf 40 so that once the catch 48 of the electronics module shelf 40 engages the pin support and stop 24, the bottom wall 28 of the pin support and stop 24 supports the pin 48 and the rear of the electronics module shelf 40 while the service technician manually supports the front of the electronics module shelf 40. The service technician may then rotate the electronics module shelf 40 by lowering the front of the shelf 40 using the pins 48 supported by the pin support and stop 24 as a pivot. As noted above, the electronics module shelf 40 is tilted until the top of the electronics module shelf 40 faces out from the front of the rack mount system. As is evident, the electronics module shelves 40 that are located above the floor (or other surface supporting the rack mount system) at a height that is at least approximately the depth of the electronics module shelf 20 can be tilted down fully. The electronics module shelves 40 that are located at a lower height above the floor can be tilted down only partially.

When the slidable electronics module shelf 40 is fully extended and then fully tilted down, the shelf 40 is in a serviceable or fully tilted position. In other words, when the electronics module shelf 40 has been fully tilted down and in the serviceable position, electronics components on the electronics module shelf 40 may be serviced by the service technician. Alternatively, the electronics module shelf 40 may be removed from the rack mount system. It is noted that the electronics module shelf 40 may be removed from the rack mount system when the shelf 40 is in the fully extended position, in the service position, or in any position therebetween. Specifically, the electronics module shelf 40 can be removed from the rack mount system by lifting the electronics module shelf 40 such that the pins 48 are lifted up above and removed from the pin support and stop 24. As is evident, the pin support and stop 24 determines the predetermined ingress point and the predetermined egress point beyond which the electronics module shelf 40 cannot slide into or out of the frame of the rack mount system.

Although only the front end of the electronics module guide 20 is shown, the rear end of the electronics module guide 20 may simply terminate with the track 22 or may be configured similarly as the front end with the pin support and stop 24 (same or similar to that shown in FIG. 6). When the rear end of the electronics module guide 20 is configured with the pin support and stop 24, the rack mount system 10 may contain electronics modules that are installed and accessible from either the front or rear side of the rack mount system 10. In other words, the service technician can selectively install and thus access the electronics modules from the front or from the rear of the rack mount system 10. Generally, all the electronics modules of the rack mount system 10 are installed in a similar manner (from front or from rear of the rack mount system) although the electronics modules may be installed from both the front and rear within a given rack mount system 10.

Figure 7:
FIG. 7 is a partial front perspective view of the slidable electronics module shelf in a fully extended position ready to be rotated relative to or removed from the electronics module guide.
Figure 8:
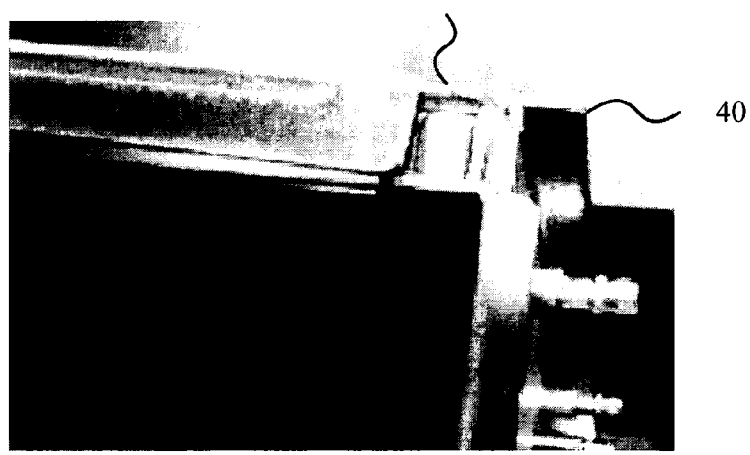
FIG. 8 is a partial front perspective view of the slidable electronics module shelf in a rotated serviceable position relative to the electronics module guide.
Figure 9:
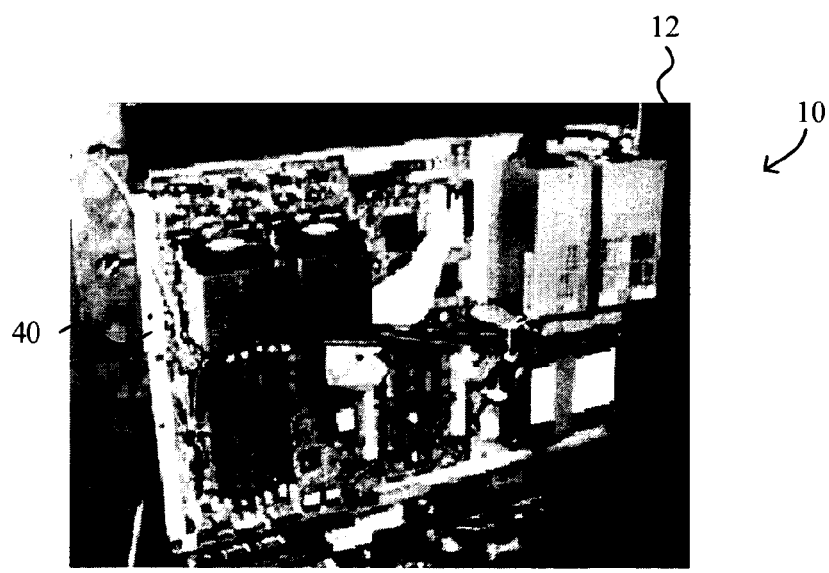
FIG. 9 is a partial front perspective view of the rack mount computing system where one of the slidable electronics module shelves is in the rotated serviceable position relative to the corresponding electronics module support.

The functionality of and the cooperation between the electronics module guide 20 and the slidable electronics module shelf 40 are illustrated in FIGS. 7-9. In particular, FIG. 7 is a partial front perspective view of the slidable electronics module shelf 40 in a fully extended position ready to be rotated relative to or removed from the electronics module guide 20. As shown, in the fully extended position, the pin 48 of the electronics module shelf 40 is engaged with the pin support and stop 24.

FIG. 8 is a partial front perspective view of the slidable electronics module shelf 40 in the rotated serviceable position relative to the electronics module guide 20 and FIG. 9 is a partial front perspective view of the rack mount computing system 10 where one of the slidable electronics module shelves 40 is in the rotated serviceable position relative to the corresponding electronics module guide 20. As shown, the various electronics components of the electronics module shelf 40 are easily accessible and thus serviceable when the electronics module shelf 40 is in the serviceable position. The serviceable position provides easy and convenient access to each electronics module shelf 40 without having to fully remove the shelf 40 from the frame 12 of the rack mount computing system 10.

Various modifications may be made to the embodiments described herein. For example, although a separate pin 48 may be provided on each side of the shelf 40, the pin 48 may alternatively be a single pin extending the full width of the shelf 40. As yet another example, although the pin support and stop 24 of the electronics module guide 20 is preferably integrally formed with the track 22, the track 22 and the pin support and stop 24 may be separated formed of the same or different materials. In addition, although the opposing pin supports 24 of the opposing pair of electronics module guides 20 may be separate components, the opposing pin supports 24 may be integrally formed such that there is a single continuous front wall and a single continuous adjacent bottom wall extending approximately the interior width of the frame of the rack mount system. Such a pin support would thus be a single pin support extending approximately the interior width of the frame of the rack mount system. Such an integral pin support may also be employed on one or both ends of the electronics module guide 20.

While the preferred embodiments of the present invention are described and illustrated herein, it will be appreciated that they are merely illustrative and that modifications can be made to these embodiments without departing from the spirit and scope of the invention. Thus, the invention is intended to be defined only in terms of the following claims.

What is claimed is:

1. A system for providing access to components of a rack mount computing system, comprising:
    a slidable electronics module shelf having a front shelf end and a rear shelf end, the shelf including an electronics components region and a rear catch mechanism at the rear shelf end, the rear catch mechanism includes at least one pivot; and
    a pair of opposing electronics module guides to support and guide the shelf relative thereto, the guides having a front guide end and a rear guide end, each guide including a track to support and guide the shelf thereon, the guides further including a pivot support disposed at the front guide end and configured to engage the pivot of the rear catch mechanism at the rear shelf end of the shelf, whereupon the shelf is pivotable about the pivot, the pivot being supported by the pivot support of the guides such that when the front shelf end of the slidable electronics module shelf is lowered relative to the rear shelf end of the slidable electronics module shelf, the electronics module guides substantially support the slidable electronics module via the at least one pivot of the rear catch mechanism.

2. The system of claim 1, wherein the pivot support of the electronics module guides includes a front guide wall and a bottom guide wall adjoining the front guide wall.

3. The system of claim 1, wherein the pivot support includes a front wall to engage the pivot whereupon the front wall stops the slidable electronics module shelf from sliding past the front wall away from the front guide end.

4. The system of claim 1, wherein the pivot is disposed below the electronics components region.

5. The system of claim 1, wherein the slidable electronics module shelf includes two pivots corresponding to the pair of opposing electronics modules guides.

6. The system of claim 1, wherein the electronics module guides include two pivot supports, each corresponding to one of the electronics module guides.

7. The system of claim 1, wherein the slidable electronics module shelf further includes at least one front stop at the front shelf end configured to engage the pivot support of the electronics module guides, whereupon the front stop stops the slidable electronics module shelf from sliding past the pivot support toward the rear guide end.

8. The system of claim 1, wherein the pivot is coupled to the electronics components region via a connector.

9. The system of claim 1, wherein the pivot support is disposed below the track.

10. The system of claim 1, wherein the pivot slides below the track as the front shelf end of the shelf slides away from the front guide end of the guides.

11. The system of claim 10, wherein the pivot cooperate with the track to prevent the slidable electronics module shelf from being disengaged with the tracks prior to the pivot of the shelf engaging the pivot support of the guides.

12. The system of claim 1, wherein the shelf is pivotable about the pivot such that the front shelf end tilts down to below the rear shelf end whereupon the shelf is substantially supported by the pivot support.

13. The system of claim 1, wherein the guides further include a second pivot support disposed at the rear guide end.

14. A shelf support system, comprising:
    a slidable shelf having a front shelf end and a rear shelf end, the shelf including a storage mounting region and a rear catch mechanism at the rear shelf end, the rear catch mechanism includes at least one pivot;
    a pair of opposing shelf tracks having a front track end and a rear track end, the tracks being configured to support and guide the shelf relative thereto, the shelf being in a stored position when the front shelf end is approximately adjacent to the front track end and the rear shelf end is approximately adjacent to the rear track end; and
    a pivot support disposed at the front track end and configured to engage the pivot of the rear catch mechanism at the rear shelf end of the shelf when the rear shelf end of the shelf is approximately adjacent to the front track end of the tracks, whereupon the pivot of the shelf is supported by the pivot support and the shelf is pivotable about the pivot such that when the front shelf end of the slidable shelf is lowered relative to the rear shelf end of the slidable shelf, the pivot support substantially supports the slidable shelf via the at least one pivot of the rear catch mechanism.

15. The system of claim 14, wherein the pivot support includes a front guide wall and a bottom guide wall adjoining the front guide wall.

16. The system of claim 14, wherein the pivot support includes a front wall to engage the pivot whereupon the front wall stops the slidable shelf from sliding past the front wall away from the front track end.

17. The system of claim 14, wherein when the shelf is in the stored position, the track is between the pivot and the storage mounting region.

18. The system of claim 17, wherein the pivot cooperate with the track to prevent the slidable shelf from being disengaged with the tracks prior to the pivot of the shelf engaging the pivot support.

19. The system of claim 14, wherein the slidable shelf includes two pivots corresponding to the pair of opposing tracks.

20. The system of claim 14, wherein the tracks include two pivot supports, each corresponding to one of the tracks.

21. The system of claim 14, wherein the slidable shelf further includes at least one front stop at the front shelf end configured to engage the pivot support of the tracks, whereupon the front stop stops the slidable shelf from sliding past the pivot support toward the rear track end.

22. The system of claim 14, wherein the pivot is coupled to the storage mounting region via a connector.

23. The system of claim 14, wherein the pivot support is disposed below the track.

24. The system of claim 14, wherein the shelf is pivotable about the pivot such that the front shelf end tilts down to below the rear shelf end whereupon the shelf is substantially supported by the pivot support.

25. The system of claim 14, further comprising another of said pivot support disposed at the rear track end.

* * * * *